United States Patent
Kim et al.

(10) Patent No.: US 9,960,318 B2
(45) Date of Patent: May 1, 2018

(54) LIGHT EMITTING DIODE WITH HIGH EFFICIENCY

(71) Applicant: Seoul Viosys Co., Ltd., Ansan-si (KR)

(72) Inventors: Tae Gyun Kim, Ansan-si (KR); Joon Hee Lee, Ansan-si (KR); Ki Hyun Kim, Ansan-si (KR); Sung Su Son, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days. days.

(21) Appl. No.: 15/288,043

(22) Filed: Oct. 7, 2016

(65) Prior Publication Data

US 2017/0025571 A1    Jan. 26, 2017

Related U.S. Application Data

(63) Continuation of application No. PCT/KR2016/004843, filed on May 10, 2016.

(30) Foreign Application Priority Data

May 22, 2015  (KR) .................. 10-2015-0071906
Apr. 20, 2016  (KR) .................. 10-2016-0048327

(51) Int. Cl.
*H01L 33/10* (2010.01)
*H01L 33/14* (2010.01)
*H01L 33/38* (2010.01)

(52) U.S. Cl.
CPC ............ *H01L 33/145* (2013.01); *H01L 33/10* (2013.01); *H01L 33/38* (2013.01)

(58) Field of Classification Search
None
See application file for complete search history.

(56) References Cited

U.S. PATENT DOCUMENTS

2007/0290215 A1  12/2007  Kato et al.
2008/0173885 A1  7/2008  Kuromizu
(Continued)

FOREIGN PATENT DOCUMENTS

JP  2007-221029  8/2007
JP  2013-118293  6/2013
(Continued)

OTHER PUBLICATIONS

International Search Report dated Aug. 9, 2016, in International Application No. PCT/KR2016/004843.
(Continued)

*Primary Examiner* — Charles Garber
*Assistant Examiner* — Alia Sabur
(74) *Attorney, Agent, or Firm* — H.C. Park & Associates, PLC

(57) ABSTRACT

A light emitting diode includes a light emitting structure including first and second conductive type semiconductor layers, an active layer, a first electrode electrically connected to the first conductive type semiconductor layer, a current blocking layer disposed on a lower surface of the light emitting structure, and a second electrode electrically connected to the second conductive type semiconductor layer. The second electrode includes a first reflective metal layer adjoining the second conductive type semiconductor layer, and a second reflective metal layer covering a lower surface of the current blocking layer and a lower surface of the first reflective metal layer, and adjoining the second conductive type semiconductor layer. A contact resistance between the second reflective metal layer and the second conductive type semiconductor layer is higher than a contact resistance between the first reflective metal layer and the second conductive type semiconductor layer.

20 Claims, 6 Drawing Sheets

(56) References Cited

U.S. PATENT DOCUMENTS

| | | | |
|---|---|---|---|
| 2011/0101304 A1* | 5/2011 | Song | H01L 33/0079 257/13 |
| 2011/0215352 A1* | 9/2011 | Jeong | H01L 33/0079 257/94 |
| 2012/0119243 A1* | 5/2012 | Kim | H01L 33/38 257/98 |
| 2014/0231849 A1 | 8/2014 | Song et al. | |
| 2015/0171271 A1* | 6/2015 | Inoue | H01L 33/38 257/98 |
| 2016/0181479 A1* | 6/2016 | Kim | H01L 33/486 257/98 |

FOREIGN PATENT DOCUMENTS

| | | |
|---|---|---|
| KR | 10-2012-0037636 | 4/2012 |
| KR | 10-2012-0039611 | 4/2012 |
| KR | 20120126824 | 11/2012 |
| KR | 10-2014-0103397 | 8/2014 |
| TW | 200816519 | 4/2008 |

OTHER PUBLICATIONS

International Written Opinion dated Aug. 9, 2016, in International Application No. PCT/KR2016/004843.

\* cited by examiner

LIGHT EMITTING DIODE WITH HIGH EFFICIENCY

CROSS-REFERENCE TO RELATED APPLICATIONS

This application is a Continuation of International Patent Application No. PCT/KR2016/004843, filed on May 10, 2016, and claims priority from and the benefit of Korean Patent Application No. 10-2015-0071906, filed on May 22, 2015, and Korean Patent Application No. 10-2016-0048327, filed on Apr. 20, 2016, all of which are incorporated by reference for all purposes as if fully set forth herein.

BACKGROUND

Field

Exemplary embodiments relates to a light emitting diode, and, more particularly, to a light emitting diode including a reflective metal layer for improving light extraction efficiency.

Discussion of the Background

A light emitting diode (LED) is a solid state device configured to convert electrical energy into light. LEDs are generally applied to various light sources, such as backlight units, lighting apparatuses, signal boards, large displays, and the like. As the usage of LEDs for lighting and its application to high current and high output devices is increasing, there is a need for development of an electrode technology, which may improve reliability of electrodes that provide electrical connection to an external structure, such as a module or semiconductor layers of an LED, and improve light extraction efficiency of an LED.

SUMMARY

Exemplary embodiments provide a light emitting diode that improves light extraction efficiency by preventing a barrier metal layer from absorbing light.

Exemplary embodiments also provide a light emitting diode that includes regions having different electrical junction characteristics on a lower surface of a second conductive type semiconductor layer to improve current spreading efficiency.

Exemplary embodiments further provide a light emitting diode having high reliability by preventing delamination of an electrode connected to a second conductive type semiconductor layer.

According to an exemplary embodiment of the present invention, a light emitting diode includes a light emitting structure including a second conductive type semiconductor layer, an active layer disposed on an upper surface of the second conductive type semiconductor layer, and a first conductive semiconductor layer disposed on an upper surface of the active layer, a first electrode electrically connected to the first conductive type semiconductor layer, a current blocking layer disposed on a lower surface of the light emitting structure, and a second electrode electrically connected to the second conductive type semiconductor layer. The second electrode includes a first reflective metal layer adjoining the second conductive type semiconductor layer, and a second reflective metal layer covering a lower surface of the current blocking layer and a lower surface of the first reflective metal layer while adjoining a portion of the second conductive type semiconductor layer. A contact resistance between the second reflective metal layer and the second conductive type semiconductor layer is higher than a contact resistance between the first reflective metal layer and the second conductive type semiconductor layer.

According to an exemplary embodiment of the present invention, a light emitting diode includes a light emitting structure including a second conductive type semiconductor layer, an active layer disposed on an upper surface of the second conductive type semiconductor layer, and a first conductive semiconductor layer disposed on an upper surface of the active layer, a first electrode electrically connected to the first conductive type semiconductor layer, a current blocking layer disposed on a lower surface of the light emitting structure, and a second electrode disposed on a lower surface of the light emitting structure and electrically connected to the second conductive type semiconductor layer. The second electrode includes a first reflective metal layer adjoining the second conductive type semiconductor layer, and a second reflective metal layer covering a lower surface of the current blocking layer and a lower surface of the first reflective metal layer. A bonding strength between the current blocking layer and the second reflective metal layer is greater than a bonding strength between the current blocking layer and the first reflective metal layer.

According to exemplary embodiments, a lower surface of a second conductive type semiconductor layer of a light emitting diode includes regions having different electrical junction characteristics, thereby improving current spreading efficiency. In this manner, the light emitting diode may reduce forward voltage and increase output voltage. Further, the light emitting diode may prevent delamination of a second electrode by securing high bonding strength between a current blocking layer and a second reflective metal layer, thereby improving reliability.

BRIEF DESCRIPTION OF THE DRAWINGS

The above and other aspects, features and advantages of the present invention will be more clearly understood from the following detailed description taken in conjunction with the accompanying drawings, in which.

DETAILED DESCRIPTION OF THE ILLUSTRATED EMBODIMENTS

Figure 1A:
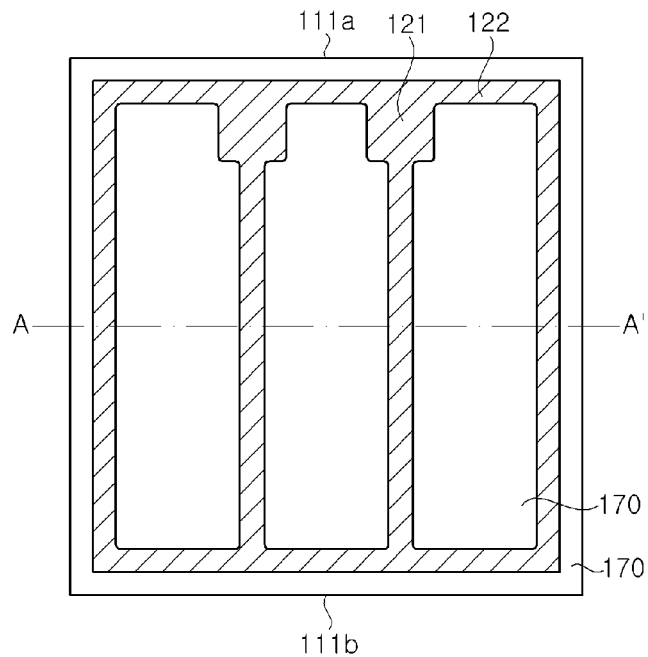
FIG. 1A and FIG. 1B are plan views of a light emitting diode according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
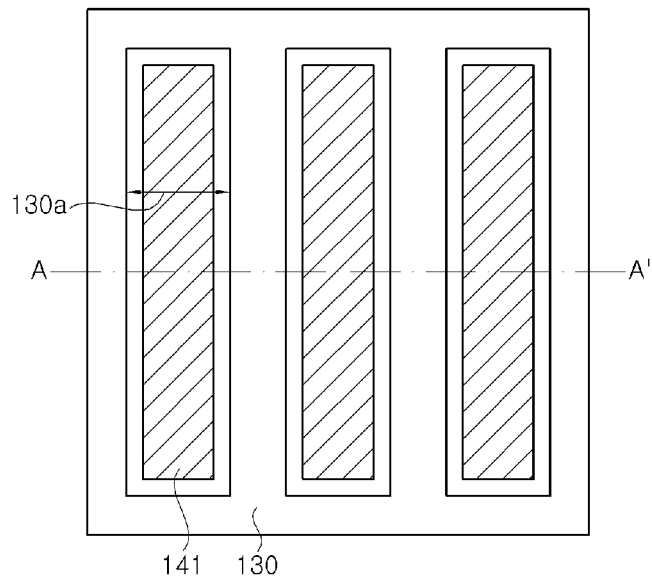
Figure 2:
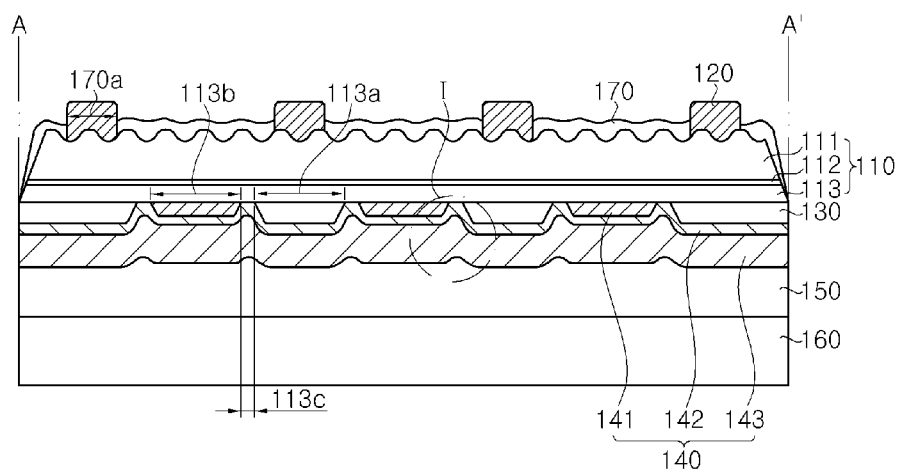
FIG. 2 is a cross-sectional view of a light emitting diode according to an exemplary embodiment of the present invention.
Figure 3:
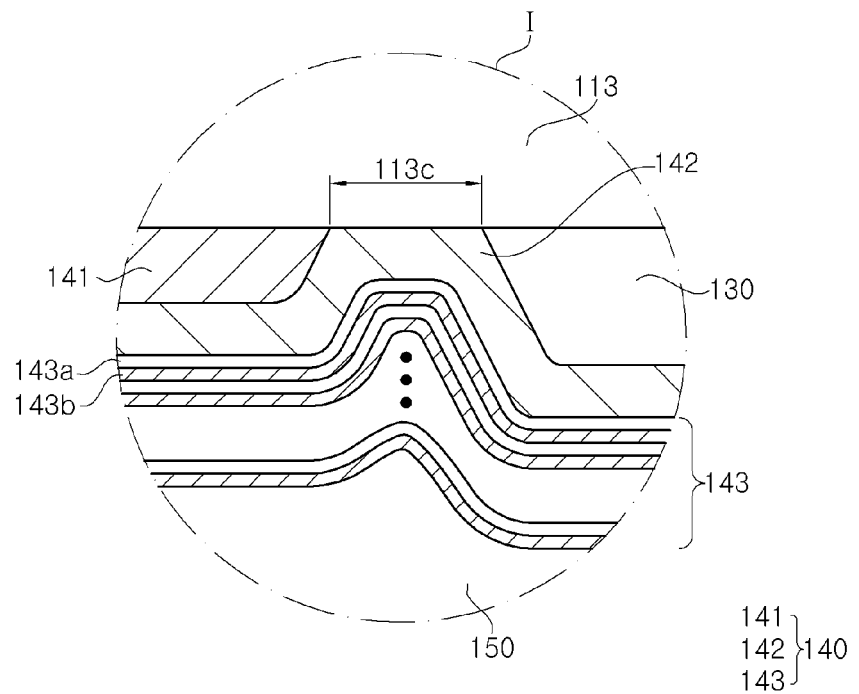
FIG. 3 is an enlarged view of part I of FIG. 2.
Figure 4A:
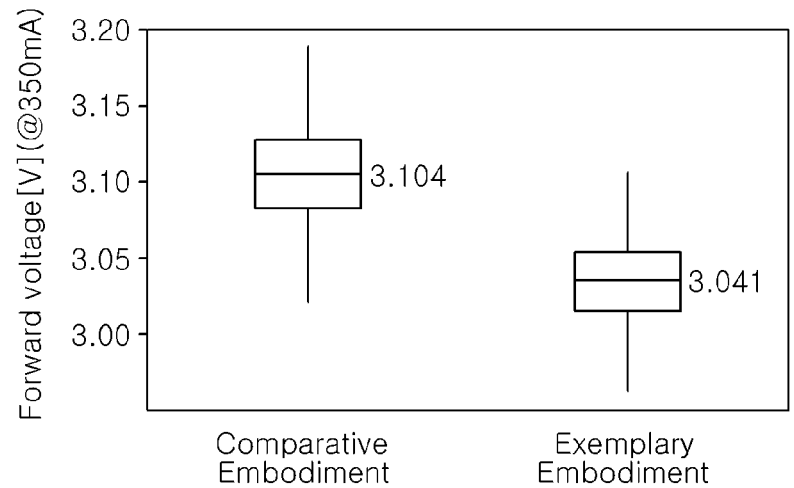
FIG. 4A and FIG. 4B show graphs illustrating performance of a light emitting diode according to an exemplary embodiment of the present invention and that of a comparative embodiment.
Figure 4B:
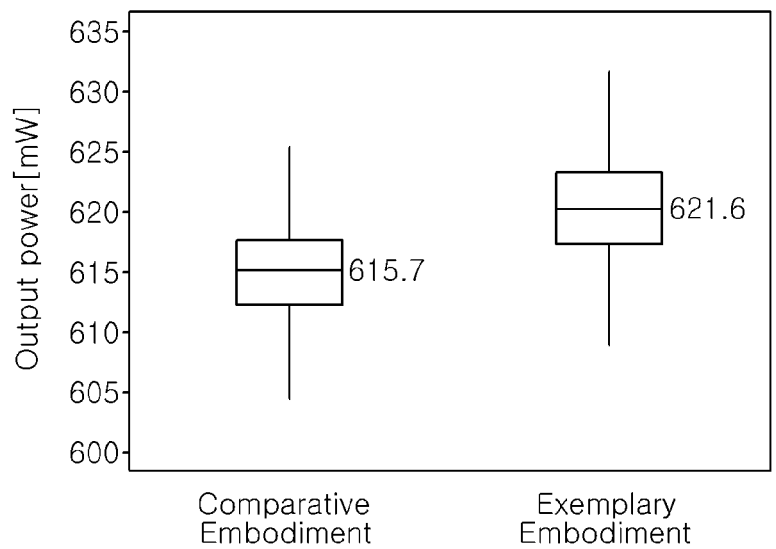

A light emitting diode according to an exemplary embodiment of the present invention will be described with reference to FIGS. 1 to 4. FIG. 1A is a top plan view of the light emitting diode and FIG. 1B is a top plan view of a lower structure of a second reflective metal layer of the light emitting diode. FIG. 2 is a cross-sectional view taken along line A-A' of FIG. 1, and FIG. 3 is an enlarged view of part I of FIG. 2. FIG. 4A shows a graph comparing forward voltage of the light emitting diode according to an exemplary embodiment of the present invention with that of a conventional light emitting diode. FIG. 4B shows a graph comparing output power of the light emitting diode according to an exemplary embodiment of the present invention with that of the conventional light emitting diode.

Referring to FIG. 1 to FIG. 3, the light emitting diode according to the present exemplary embodiment includes a light emitting structure 110, a first electrode 120, a current blocking layer 130, and a second electrode 140, and may further include an insulation layer 170 and a substrate 160.

The light emitting structure 110 may include a second conductive type semiconductor layer 113, an active layer 112 disposed on an upper surface of the second conductive type semiconductor layer 113, and a first conductive type semiconductor layer 111 disposed on an upper surface of the active layer 112. The first conductive type semiconductor layer 111, the active layer 112, and the second conductive type semiconductor layer 113 may include a III-V based compound semiconductor, for example, a nitride-based semiconductor such as (Al, Ga, In)N. The first conductive type semiconductor layer 111 may include an n-type dopant (for example, Si) and the second conductive type semiconductor layer 113 may include a p-type dopant (for example, Mg), or vice versa. The active layer 112 may include a multi-quantum well (MQW) structure, and may have a compositional ratio that may emit light having a desired peak wavelength. Particularly, the active layer 112 may include an InGaN well layer to emit blue light or near ultraviolet light.

The light emitting structure 110 may be formed by sequentially stacking the first conductive type semiconductor layer 111, the active layer 112, and the second conductive type semiconductor layer 113 on a growth substrate (not shown). The growth substrate may be any substrate that is capable of growing the first conductive type semiconductor layer 111, the active layer 112, and the second conductive type semiconductor layer 113 thereon. For example, the growth substrate may include, a sapphire substrate, a silicon carbide substrate, a gallium nitride substrate, an aluminum nitride substrate, a silicon substrate, and the like. Specifically, in the present exemplary embodiment, the growth substrate may be a patterned sapphire substrate (PSS). The growth substrate may be removed from the light emitting structure 110, whereby an upper surface of the light emitting structure 110 may have a shape that corresponds to the pattern of the growth substrate. Specifically, when the growth substrate includes a rounded pattern, the upper surface of the light emitting structure 110 may also include a rounded shape.

A side surface of the light emitting structure 110 may have an inclined surface. Referring to FIG. 2, the inclined surface may have an angle of 90° or less, for example, 60°, with respect to a lower surface of the first conductive type semiconductor layer 111. The inclined surface of the light emitting structure 110 may improve emission of light generated in the light emitting structure 110. The inclined surface may be formed by a dicing process for individually dividing light emitting diodes, or may be formed by a separate etching process.

At least one or more first electrodes 120 may be disposed on an upper surface of the light emitting structure 110. The first electrode 120 may be electrically connected to the first conductive type semiconductor layer 111. The first electrode 120 may have a single layer or multilayer structure of Ni, Al, Au, Cr, and the like. The first electrode 120 may be formed by depositing a metallic material to the upper surface of the light emitting structure 110, and patterning the metallic material.

A lower surface of the first electrode 120 adjoins an upper surface of the first conductive type semiconductor layer 111. When the upper surface of the first conductive type semiconductor layer 111 includes a pattern, a lower surface of the first electrode 120 may include a shape corresponding to the pattern of the upper surface of the first conductive type semiconductor layer 111. For example, when the upper surface of the first conductive type semiconductor layer 111 includes a rounded pattern, the lower surface of the first electrode 120 disposed on the rounded pattern may also have a rounded shape. In this manner, when a wire is coupled to the first electrode 120, the wire may be stably bonded to the first electrode 120 via the shape of the upper surface of the first electrode 120.

The first electrode 120 may include at least one bonding pad 121 and an upper extension 122. The bonding pad 121 may guide electric current applied to the light emitting structure 110 to flow outside. In the present exemplary embodiment, the bonding pad 121 may be disposed near one side of the light emitting structure 110. Specifically, the first conductive type semiconductor layer 111 includes a first side surface 111a and a second side surface 111b opposing the first side surface 111a, and the bonding pad 121 may be placed near the first side surface 111a. Although FIG. 1A shows that the first electrode 120 includes two bonding pads 121, it is contemplated that, however, the number of the bonding pads 121 in the first electrode 120 may be varied. For example, the first electrode 120 may include one bonding pad 121 or three or more bonding pads 121.

The upper extension 122 may extend from the bonding pad 121. The upper extension 122 may prevent current crowding near the bonding pad 121 when the current is applied to the light emitting diode. Specifically, a portion of the upper extension 122 may be disposed along four sides of the first conductive type semiconductor layer 111. Furthermore, the other portion of the upper extension 122 may be disposed between the bonding pads 121 and near the second side surface 111b.

The current blocking layer 130 may be disposed on a lower surface of the light emitting structure 110. The current blocking layer 130 may at least overlap a portion of the first electrode 120 in a vertical direction. The current blocking layer 130 may include a first region 113a adjoining the second conductive type semiconductor layer 113. The current blocking layer 130 may prevent electric current applied to the light emitting diode from crowding on the semiconductor layer near the first electrode 120, thereby preventing deterioration of current spreading efficiency. The first region 113a may overlap the first electrode 120 in the vertical direction, so as to prevent current crowding more effectively. Particularly, the current blocking layer 130 may be formed to have a greater width than the upper extension 122 in order to improve light output through efficient spreading of electric current. Particularly, referring to FIGS. 1A and 1B, the current blocking layer 130 may be disposed beyond both sides of the upper extension 122 in a width direction, in a portion where the current blocking layer 130 overlaps the upper extension 122 in the vertical direction. Accordingly, the current blocking layer 130 may have a width greater than about three times the width of the upper extension 122, in order to achieve significant improvement in light output.

For example, when the upper extension 122 of the first electrode 120 has a width of 15 µm, the width of the current blocking layer 130 may exceed about 45 µm, such that the upper extension 122 may be disposed on an upper side of a central region of the current blocking layer 130. However, since an excessively large width of the current blocking layer 130 may increase forward voltage, the width of the current blocking layer 130 may be about four times or less the width of the upper extension 122. Adjustment of the widths of the upper extension 122 and the current blocking layer 130 disposed under the upper extension 122 may be applied to an overall region of the upper extension 122, or may be applied to some region thereof. Particularly, width adjustment may be applied to the upper extension 122 and the current blocking layer 130 disposed inside the light emitting diode, rather than along an edge of the light emitting diode, similarly to the upper extension 122 that connects a portion of the upper extension 122 disposed near the second side surface 111b to the bonding pads 121.

The current blocking layer 130 may include an insulating material. For example, the current blocking layer 130 may include $SiO_x$ or $SiN_x$, or may include a distributed Bragg reflector (DBR), in which layers having different refraction indices are stacked one above another. That is, the current blocking layer 130 may transmit or reflect light having a certain wavelength. The current blocking layer 130 may have a single layer or multiple layers structure, formed through chemical vapor deposition (CVD) or the like.

The current blocking layer 130 may include at least one opening 130a that exposes the second conductive type semiconductor layer 113. Referring to FIG. 1B, the opening 130a may have a rectangular shape, however, the opening 130a may have various shapes, such as a circular shape. The opening 130a may be formed by using a mask, or through deposition of the current blocking layer 130 and etching the current blocking layer 130.

A side surface of the current blocking layer 130 may include an inclined surface. Referring to FIG. 2 and FIG. 3, an angle between a lower surface of the current blocking layer 130 and the side surface of the current blocking layer 130 may be greater than 90° and less than 180°. When the side surface of the current blocking layer 130 is inclined, a portion of a second reflective metal layer 142, which covers the side surface of the current blocking layer 130, is disposed along the inclined side surface of the current blocking layer 130, thereby more effectively reflecting light generated by the active layer 112 towards an upper side of the light emitting structure 110. In this manner, a junction area between the current blocking layer 130 and the second reflective metal layer 142 may be increased, thereby improving mechanical reliability of the light emitting diode.

The second electrode 140 may be disposed on the lower surface of the light emitting structure 110. The second electrode 140 may be electrically connected to the second conductive type semiconductor layer 113. The second electrode 140 may include a first reflective metal layer 141, a second reflective metal layer 142, and a barrier metal layer 143.

The first reflective metal layer 141 may adjoin the second conductive type semiconductor layer 113. In addition, the first reflective metal layer 141 may form ohmic contact with the second conductive type semiconductor layer 113. The first reflective metal layer 141 includes a second region 113b that forms ohmic contact with the second conductive type semiconductor layer 113 through the opening 130a. The first reflective metal layer 141 may be spaced apart from the current blocking layer 130.

The first reflective metal layer 141 may include a metal or an alloy capable of reflecting light emitted from the light emitting structure 110. For example, the first reflective metal layer 141 may include Ag, Ag alloy, Ni/Ag, NiZn/Ag, TiO/Ag, or Ni/Ag/Ni/Ti layers, and may be formed through deposition and patterning. Particularly, when the second conductive type semiconductor layer 113 is a p-type semiconductor layer, the first reflective metal layer 141 may include, for example, an Ni layer, which forms ohmic contact with the second conductive type semiconductor layer 113. Since the Ni layer deteriorates reflectivity of Ag, due to low reflectivity with respect to light generated from the light emitting structure 110, the Ni layer may have a thin thickness. The first reflective metal layer 141 may be formed by e-beam evaporation, vacuum deposition, sputtering, or metal organic chemical vapor deposition (MOCVD).

The second reflective metal layer 142 may cover the current blocking layer 130 and the first reflective metal layer 141. Specifically, the second reflective metal layer 142 may be disposed to cover a lower surface and side surfaces of the current blocking layer 130, and a lower surface and side surfaces of the first reflective metal layer 141. The second reflective metal layer 142 may adjoin the current blocking layer 130 and the first reflective metal layer 141. Furthermore, the second reflective metal layer 142 may adjoin a portion of the second conductive type semiconductor layer 113 through the opening 130a. Specifically, the second reflective metal layer 142 may include a third region 113c corresponding to a gap between the first reflective metal layer 141 and the current blocking layer 130, through which a portion of a lower surface of the second conductive type semiconductor layer 113 is exposed.

The second reflective metal layer 142 may be disposed between the current blocking layer 130 and a barrier metal layer 143 described below and/or between the first reflective metal layer 141 and the barrier metal layer 143.

The second reflective metal layer 142 may include a metal having different reflectivity than the metal of the first reflective metal layer 141. Specifically, when the first reflective metal layer 141 includes Ag, the second reflective metal layer 142 may include Al. Ag has a reflectivity of about 98.9% and Al has a reflectivity of about 90.3%.

Referring to FIG. 1 to FIG. 3, the first region 113a, the second region 113b, and the third region 113c may have different electrical junction characteristics and exhibit different reflection characteristics. Specifically, the first region 113a, the second region 113b, and the third region 113c may have different contact resistances due to the different electrical junction characteristics thereof.

Contact resistance of the third region 113c (e.g., between the second reflective metal layer 142 and the second conductive type semiconductor layer 113) may be higher than the contact resistance of the second region 113b (e.g., the first reflective metal layer 141 and the second conductive type semiconductor layer 113). In this manner, the second reflective metal layer 142 may reflect light while reducing forward voltage through current spreading.

The second reflective metal layer 142 may include a metal having higher work function than the first reflective metal layer 141. Specifically, the second reflective metal layer 142 may form Schottky junction with the second conductive type semiconductor layer 113. When an area of the first region 113a (or an area of the current blocking layer 130 adjoining the second conductive type semiconductor layer 113) is increased, light extraction efficiency may be deteriorated from the decrease in a reflective area of the second electrode 140. Conversely, when an area of the first region 113a is decreased, current spreading efficiency of the light emitting diode may be decreased. According to the present exemplary embodiment, when the second reflective metal layer 142 forms Schottky junction in the third region 113c, most current may be applied to the second electrode 140 through the second region 113b, which forms ohmic contact. Further, since the third region 113c may also reflect light generated in the light emitting structure 110, current spreading and light extraction efficiency may be improved while minimizing the area of the current blocking layer 130.

Furthermore, when the second reflective metal layer 142 includes Al, the second reflective metal layer 142 may be in ohmic contact with the second conductive type semiconductor layer 113. In this structure, however, in order to form ohmic contact between the second reflective metal layer 142 and the second conductive type semiconductor layer 113, heat treatment at a temperature of 700° C. or higher may be required, which may damage the light emitting structure 110 from heat. However, according to the present exemplary embodiment, the second reflective metal layer 142 forms Schottky junction with the second conductive type semiconductor layer 113, instead of ohmic contact, so long as the second reflective metal layer 142 has light reflection characteristics. Accordingly, the light emitting structure 110 according to the present exemplary embodiment may obviate the need of utilizing a high heat treatment with respect to the second reflective metal layer 142, while maximizing reflection of light by the second electrode 140 when the light is generated in the light emitting structure 110. That is, as compared with the structure wherein the second reflective metal layer 142 is omitted, an effective area of the second electrode 140 that may reflect light is increased, thereby improving light extraction efficiency.

The third region 113c may have a smaller area than the second region 113b. Accordingly, since the third region 113c forming Schottky junction with the second conductive type semiconductor layer 113 has a small area, overall resistance of the light emitting diode may be reduced, thereby further reducing forward voltage (Vf).

When the current blocking layer 130 includes a distributed Bragg reflector (DBR), the current blocking layer 130 may reflect light in a wide wavelength band. Particularly, when the active layer 112 emits light near UV light, the light may be reflected by the distributed Bragg reflector (DBR), thereby improving light extraction efficiency. On the other hand, the second reflective metal layer 142 disposed under the current blocking layer 130 reflects light passing through the current blocking layer 130, thereby improving light extraction efficiency. Particularly, when the current blocking layer 130 includes the distributed Bragg reflector (DBR), the second reflective metal layer 142 and the current blocking layer 130 may reflect substantially overall wavelength band of light emitted from the active layer 112. For example, when light emitted from the active layer 112 is near UV light, high reflectivity may be achieved through the current blocking layer 130 and the second reflective metal layer 142. Furthermore, combination of the second reflective metal layer 142 and the current blocking layer 130 may achieve high reflectivity with respect to light entering the current blocking layer 130 at various incident angles.

Bonding strength between the second reflective metal layer 142 and the current blocking layer 130 may be greater than the bonding strength between the first reflective metal layer 141 and the current blocking layer 130. Specifically, when the first reflective metal layer 141 includes Ag and the second reflective metal layer 142 includes Al, bonding strength between Al of the second reflective metal layer 142 and the current blocking layer 130 may be greater than that of Ag of the first reflective metal layer 141 and the current blocking layer 130. A portion of the second reflective metal layer 142 may cover the lower surface and side surfaces of the current blocking layer 130. In this manner, light passing through the lower surface and side surfaces of the current blocking layer 130 may be reflected by the second reflective metal layer 142. Furthermore, since the current blocking layer 130 adjoins the second reflective metal layer 142, instead of the first reflective metal layer 141 having low bonding strength with the current blocking layer 130, delamination of the second electrode 140 from the current blocking layer 130 may be prevented, thereby improving the reliability of the light emitting diode.

The second reflective metal layer 142 may be formed by e-beam evaporation, vacuum deposition, sputtering, or metal organic chemical vapor deposition (MOCVD).

The barrier metal layer 143 may be disposed on the lower surface of the second reflective metal layer 142. The barrier metal layer 143 may be spaced apart from the first reflective metal layer 141 and the current blocking layer 130 by the second reflective metal layer 142. When the barrier metal layer 143 adjoins the current blocking layer 130, light passing through the current blocking layer 130 may be absorbed into the barrier metal layer 143. However, since the second reflective metal layer 142 having higher reflectivity than the barrier metal layer 143 is disposed between the current blocking layer 130 and the barrier metal layer 143, light loss from absorption of light by the barrier metal layer 143 may be prevented or reduced.

The barrier metal layer 143 may prevent diffusion of Ag of the first reflective metal layer 141 to the outside of the first reflective metal layer 141. The barrier metal layer 143 may include Ni, Cr, Ti, Pt, Au, or combinations thereof. For example, referring to FIG. 3, the barrier metal layer 143 may have a structure of alternately stacked Ni layers 143a and Ti layers 143b. Since the barrier metal layer 143, particularly, the Ni layer 143a has high reflectivity with respect to light emitted from the active layer 112, there is a need to prevent light emitted from the active layer 112 from entering the Ni layer 143a. To this end, according to exemplary embodiments, the second reflective metal layer 142 is disposed between the current blocking layer 130 and the barrier metal layer 143, while adjoining the second conductive type semiconductor layer 113, such that direct contact between the Ni layer 143a and the second conductive type semiconductor layer 113 may be prevented. The barrier metal layer 143 may be formed by e-beam evaporation, vacuum deposition, sputtering, or metal organic chemical vapor deposition (MOCVD).

The light emitting diode according to the present exemplary embodiment may further include an insulation layer 170. The insulation layer 170 may be disposed on an upper surface and side surfaces of the light emitting structure 110. The insulation layer 170 may protect the light emitting structure 110 from external impact and contaminants. The insulation layer 170 may include at least one opening 170a that exposes the first electrode 120. The first electrode 120 may be exposed through the opening 170a to be connected to a wire and the like. The insulation layer 170 may include $SiO_x$ or $SiN_x$, without being limited thereto. The insulation layer 170 may include the same material as the current blocking layer 130.

The light emitting diode according to the present exemplary embodiment may further include a substrate 160. The substrate 160 may be disposed on a lower surface of the barrier metal layer 143. The substrate 160 may protect the barrier metal layer 143. In addition, the substrate 160 may support the light emitting structure 110 upon separation of a growth substrate (not shown) from the light emitting structure 110. The substrate 160 may include a conductive metal such as Cu. Referring to FIG. 2, the substrate 160 may be disposed on the lower surface of the barrier metal layer 143 via a bonding material 150. The bonding material 150 may include bonding metals such as AuSn.

Referring to FIGS. 4A and 4B, a light emitting diode according to an exemplary embodiment of the present invention has improved characteristics with respect to forward voltage $V_f$ and output power, as compared to a conventional light emitting diode of a comparative embodiment. As used herein, a conventional light emitting diode according to the comparative embodiment has substantially similar structure as the light emitting diode according to the exemplary embodiments, except that the conventional light emitting diode does not include the second reflective metal layer 142. Both light emitting diodes had a size of 1,000 μm×1,000 μm, and include the first reflective metal layer 141 of Ni/Ag/Ni/Ti layers (3 Å/2,000 Å/200 Å/3000 Å), the current blocking layer 130 of $SiO_2$ (8,000 Å), and the barrier metal layer 143 of Ti/Ni layers (14 layers, 1.4 μm) and Au (50 Å). The light emitting diode according to the present exemplary embodiment includes the second reflective metal layer 142 of Al (2,000 Å).

Referring to FIG. 4A, the light emitting diode according to the present exemplary embodiment had a forward voltage of 3.041V, and the light emitting diode according to the comparative embodiment had a forward voltage of 3.104V, and thus, it can be seen that the light emitting diode according to the present exemplary embodiment has reduced forward voltage. Referring to FIG. 4B, the light emitting diode of the present exemplary example had an output power of 621.6 mW and the light emitting diode of the comparative embodiment had an output power of 615.7 mW, and thus, it can be seen that the light emitting diode according to the present exemplary embodiment has increased output power. These experimental results show that the second reflective metal layer 142 according to the present exemplary embodiment improves light extraction efficiency of a light emitting diode.

In addition, the forward voltage $V_f$ and the light output were measured while changing the width of the current blocking layer 130 to 23 μm, 30 μm, 50 μm, and 70 μm, while the width of the upper extension 122 was fixed to 15 μm. With reference to a value obtained by setting the width of the current blocking layer to 23 μm, light output increased and forward voltage slightly increased with increasing width of the current blocking layer 130. Particularly, when the current blocking layer 130 had a width of 50 μm, the forward voltage $V_f$ insignificantly increased by less than 1% and the light output significantly increased by about 3.2%.

Figure 5:
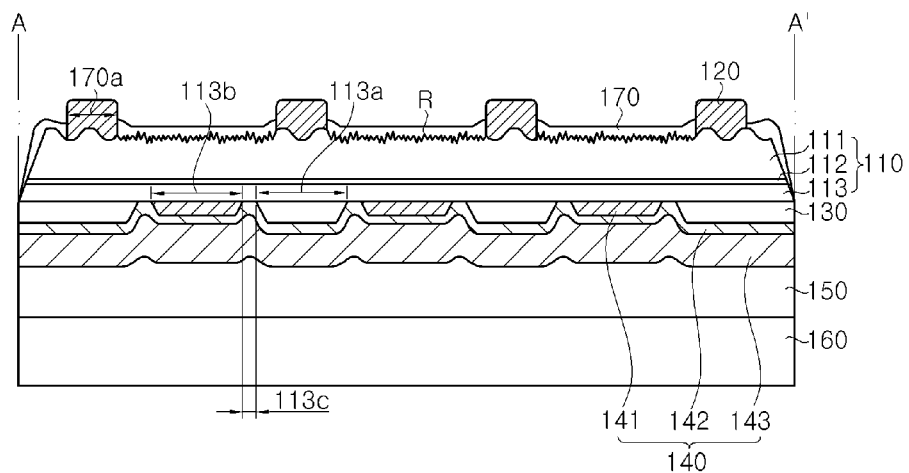
FIG. 5 is a cross-sectional view of a light emitting diode according to an exemplary embodiment of the present invention.

FIG. 5 is a cross-sectional view of a light emitting diode according to an exemplary embodiment of the present invention. The light emitting diode of FIG. 5 is similar to the light emitting diode described with reference to FIG. 1 to FIG. 3 except that an upper surface of the first conductive type semiconductor layer 111 includes a roughened surface R. The roughened surface R may prevent light generated in the light emitting structure 110 from returning back to the interior of the light emitting diode via reflection by the upper surface of the first conductive type semiconductor layer 111, thereby improving light extraction efficiency of the light emitting diode. Specifically, a portion of the upper surface of the first conductive type semiconductor layer 111, which does not adjoin the first electrode 120, may include the roughened surface R. When a portion of the upper surface of the light emitting structure 110 on which the first electrode 120 is disposed, that is, when a portion of the upper surface of the first conductive type semiconductor layer 111 adjoining the lower surface of the first electrode 120 includes the roughened surface R, the material of the first electrode 120 may be diffused to an excessively deep portion in the light emitting structure 110 along the roughened surface R. As a result, the light emitting diode may have reduced internal quantum efficiency, thereby deteriorating reliability of the light emitting diode.

Figure 6:
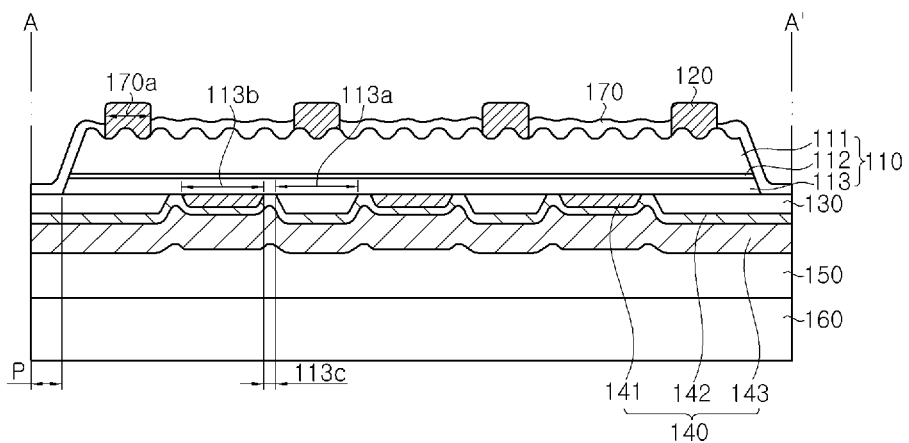
FIG. 6 is a cross-sectional view of a light emitting diode according to an exemplary embodiment of the present invention.

FIG. 6 is a cross-sectional view of a light emitting diode according to an exemplary embodiment of the present invention. The light emitting diode of FIG. 6 is similar to the light emitting diode described with reference to FIG. 1 to FIG. 3 except that side surfaces of the second reflective metal layer 142 protrude beyond the side surfaces of the light emitting structure 110. Specifically, the second reflective metal layer 142 may include a protrusion P protruding beyond the side surfaces of the light emitting structure 110. An upper surface of the second reflective metal layer 142 may have a wider area than the lower surface of the light emitting structure 110. In this manner, a portion of light emitted through the side surfaces of the light emitting structure 110 may be reflected towards an upper portion of the light emitting diode by the second reflective metal layer 142. Accordingly, the light emitting diodes may have improved light extraction efficiency.

Referring to FIG. 6, a portion of the current blocking layer 130 may be disposed on an upper surface of the protrusion P. In this manner, the upper surface of the protrusion P may be protected from external impact and contaminants. In addition, the insulation layer 170 may adjoin the current blocking layer 130. Specifically, a portion of the insulation layer 170 may adjoin the current blocking layer 130 disposed on the upper surface of the protrusion P. In this manner, a distance from a side surface of the insulation layer 170 or a side surface of the current blocking layer 130 to the light emitting structure 110 may be increased, thereby preventing external contaminants from infiltrating the light emitting diode while more effectively protecting the light emitting structure 110 from external impact. The insulation layer 170 and the current blocking layer 130 may include the same material. For example, when the current blocking layer 130 includes $SiO_2$, the insulation layer 170 may also include $SiO_2$. In this manner, high bonding strength may be generated between the insulation layer 170 and the current blocking layer 130, thereby preventing delamination of the insulation layer 170 or the current blocking layer 130 while more effectively preventing external contaminants from entering the light emitting diode.

Figure 7:
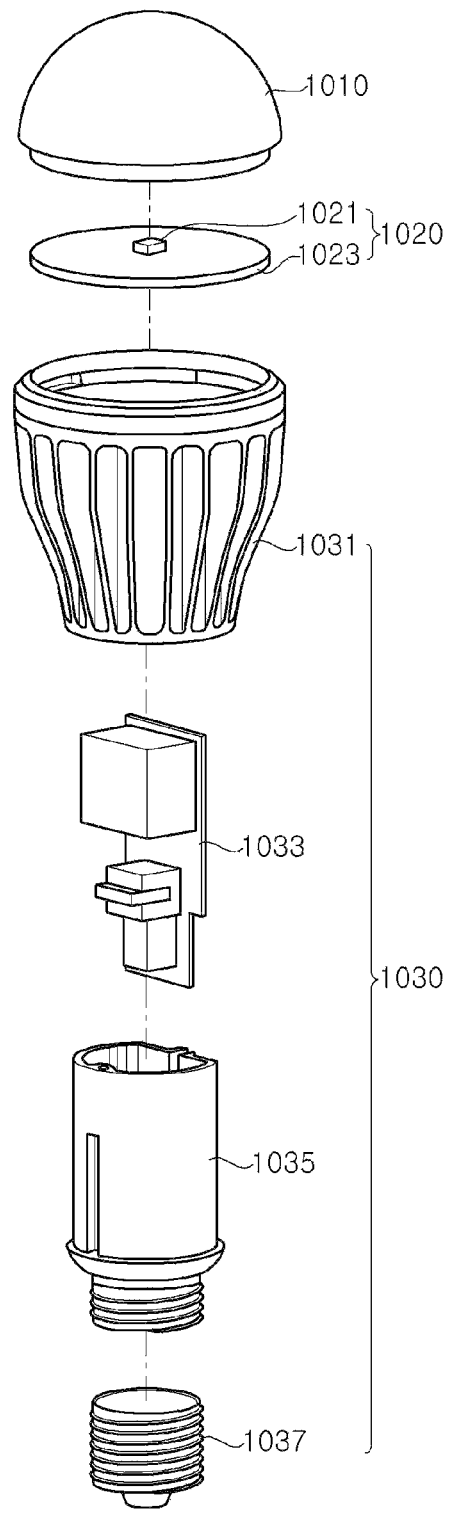
FIG. 7 is an exploded perspective view of a lighting apparatus to which a light emitting diode according to an exemplary embodiment of the present invention is applied.

FIG. 7 is an exploded perspective view of a lighting apparatus to which a light emitting diode according to an exemplary embodiment of the present invention is applied.

Referring to FIG. 7, the lighting apparatus according to the present exemplary embodiment includes a diffusive cover 1010, a light emitting diode module 1020, and a body 1030. The body 1030 may receive the light emitting diode module 1020, and the diffusive cover 1010 may be disposed on the body 1030 to cover an upper side of the light emitting diode module 1020.

The body 1030 may have any shape so long as the body 1030 may supply electric power to the light emitting diode module 1020 while receiving and supporting the light emitting diode module 1020. For example, as shown in the drawing, the body 1030 may include a body case 1031, a power supply 1033, a power supply case 1035, and a power source connection section 1037.

The power supply 1033 is received in the power supply case 1035 to be electrically connected to the light emitting diode module 1020, and may include at least one IC chip. The IC chip may regulate, change, or control electric power supplied to the light emitting diode module 1020. The power supply case 1035 may receive and support the power supply 1033. The power supply case 1035 having the power supply 1033 secured therein may be disposed within the body case 1031. The power source connection section 1037 is disposed at a lower end of the power supply case 1035 and coupled thereto. Accordingly, the power source connection section 1037 is electrically connected to the power supply 1033 within the power supply case 1035 and may serve as a passage through which power can be supplied from an external power source to the power supply 1033.

The light emitting diode module 1020 includes a substrate 1023 and a light emitting diode 1021 disposed on the substrate 1023. The light emitting diode module 1020 may be disposed at an upper portion of the body case 1031 and electrically connected to the power supply 1033.

As the substrate 1023, any substrate capable of supporting the light emitting diode 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting diode 1021 may include at least one of the light emitting diodes according to the exemplary embodiments described above.

The diffusive cover 1010 is disposed on the light emitting diode 1021 and may be secured to the body case 1031 to cover the light emitting diode 1021. The diffusive cover 1010 may be formed of a light-transmitting material, and light orientation of the lighting apparatus may be adjusted through regulation of the shape and optical transmissivity of the diffusive cover 1010. As such, the diffusive cover 1010 may be modified in various shapes depending on usage and applications of the lighting apparatus.

Figure 8:
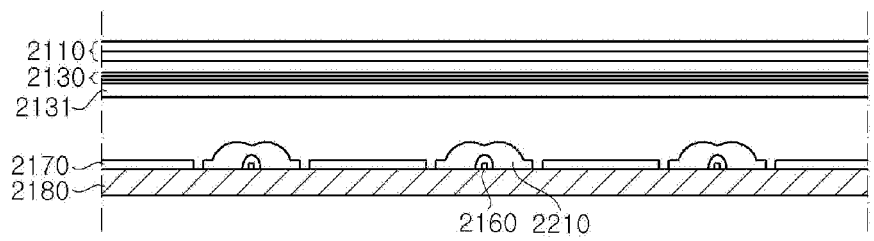
FIG. 8 is a cross-sectional view of a display to which a light emitting diode according to an exemplary embodiment of the present invention is applied.

FIG. 8 is a cross-sectional view of a display to which a light emitting diode according to an exemplary embodiment of the present invention is applied.

The display according to the present exemplary embodiment includes a display panel 2110, a backlight unit supplying light to the display panel 2110, and a panel guide (not shown) supporting a lower edge of the display panel 2110.

The display panel 2110 is not particularly limited, and may be, for example, a liquid crystal panel including a liquid crystal layer. Gate driving PCBs may be further disposed at the edge of the display panel 2110 to supply driving signals to a gate line. Here, the gate driving PCBs (not shown) may be formed on a thin film transistor substrate instead of being formed on separate PCBs.

The backlight unit includes a light source module, which includes at least one substrate and a plurality of light emitting diodes 2160. The backlight unit may further include a bottom cover 2180, a reflective sheet 2170, a diffusive plate 2131, and optical sheets 2130.

The bottom cover 2180 may be opened at an upper side thereof to receive the substrate 2150, the light emitting diodes 2160, the reflective sheet 2170, the diffusive plate 2131, and the optical sheets 2130. In addition, the bottom cover 2180 may be coupled to the panel guide (not shown). The substrate may be disposed under the reflective sheet 2170 to be surrounded by the reflective sheet 2170. Alternatively, when a reflective material is coated onto a surface thereof, the substrate may be disposed on the reflective sheet 2170. Further, a plurality of substrates may be arranged parallel to one other. However, it should be understood that other implementations are also possible and the light source module may include a single substrate.

The light emitting diodes 2160 may include at least one of the light emitting diodes according to the exemplary embodiments described above. The light emitting diodes 2160 may be regularly arranged in a predetermined pattern on the substrate. In addition, a lens 2210 is disposed on each of the light emitting diodes 2160 to improve uniformity of light emitted from the plurality of light emitting diodes 2160.

The diffusive plate 2131 and the optical sheets 2130 are disposed on the light emitting diodes 2160. Light emitted from the light emitting diodes 2160 may be supplied in the form of sheet light to the display panel 2110 through the diffusive plate 2131 and the optical sheets 2130. In this manner, the light emitting diodes according to the present exemplary embodiment may be applied to direct type displays, like the display according to the present exemplary embodiment.

Figure 9:
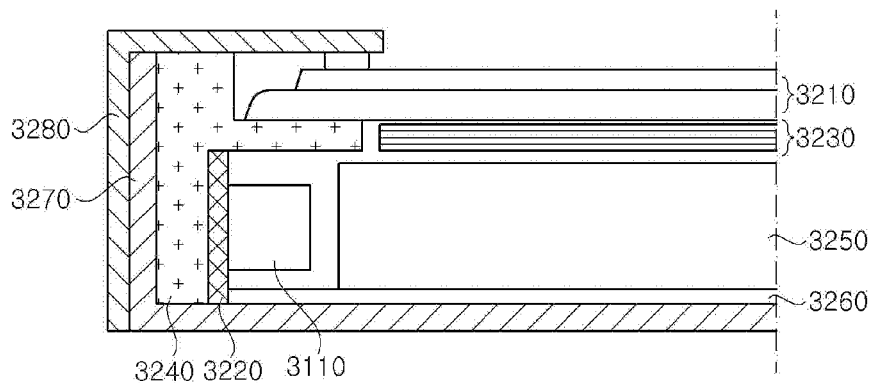
FIG. 9 is a cross-sectional view of a display to which a light emitting diode according to an exemplary embodiment of the present invention is applied.

FIG. 9 is a cross-sectional view of a display to which a light emitting diode according to an exemplary embodiment of the present invention is applied.

The display according to the present exemplary embodiment includes a display panel 3210 on which an image is displayed, and a backlight unit disposed at a rear side of the display panel 3210 and emitting light thereto. Further, the display includes a frame supporting the display panel 3210 and receiving the backlight unit, and covers 3240 and 3280 surrounding the display panel 3210.

The display panel 3210 is not particularly limited and may be, for example, a liquid crystal panel including a liquid crystal layer. A gate driving PCB may be further disposed at an edge of the display panel 3210 to supply driving signals to a gate line. Here, the gate driving PCB may be formed on a thin film transistor substrate instead of being formed on a separate PCB. The display panel 3210 is secured by the covers 3240 and 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially opened at an upper side thereof, a light source module disposed at one side inside the lower cover 3270, and a light guide plate 3250 disposed parallel to the light source module and converting spot light into sheet light. In addition, the backlight unit according to the present exemplary embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be used without limitation. For example, the substrate 3220 may include a printed circuit board. The light emitting diodes 3110 may include at least one of the light emitting diodes according to the exemplary embodiments described above. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light.

In this manner, the light emitting diodes according to the exemplary embodiments may be applied to edge type displays, like the display according to the present exemplary embodiment.

Figure 10:
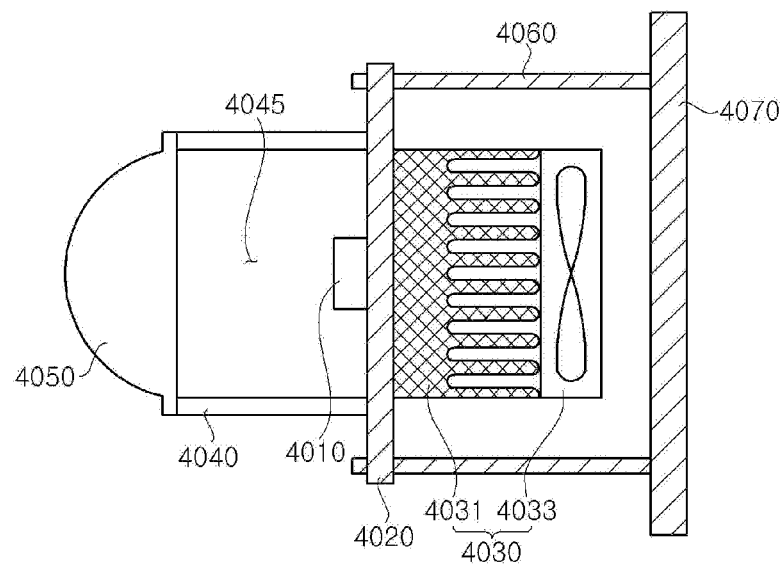
FIG. 10 is a cross-sectional view of a headlight to which a light emitting diode according to an exemplary embodiment of the present invention is applied.

FIG. 10 is a cross-sectional view of a headlight to which a light emitting diode according to an exemplary embodiment of the present invention is applied.

Referring to FIG. 10, the headlight according to the present exemplary embodiment includes a lamp body 4070, a substrate 4020, a light emitting diode 4010, and a cover lens 4050. The headlight may further include a heat dissipation unit 4030, a support rack 4060, and a connection member 4040.

The substrate 4020 is secured by the support rack 4060 and disposed above the lamp body 4070. As the substrate 4020, any member capable of supporting the light emitting diode 4010 may be used without limitation. For example, the substrate 4020 may include a substrate having a conductive pattern, such as a printed circuit board. The light emitting diode 4010 is disposed on the substrate 4020 and may be supported and secured by the substrate 4020. In addition, the light emitting diode 4010 may be electrically connected to an external power source through the conductive pattern of the substrate 4020. Further, the light emitting diode 4010 may include at least one of the light emitting diodes according to the exemplary embodiments described above.

The cover lens 4050 is disposed on a path of light emitted from the light emitting diode 4010. For example, as shown in the drawing, the cover lens 4050 may be spaced apart from the light emitting diode 4010 by the connection member 4040 and may be disposed in a direction of supplying light emitted from the light emitting diode 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting diode 4010, and thus may act as a light guide that provides a luminous path 4045. The connection member 4040 may be formed of a light reflective material or coated therewith. On the other hand, the heat dissipation unit 4030 may include heat dissipation fins 4031 and/or a heat dissipation fan 4033, and dissipates heat generated upon operation of the light emitting diode 4010.

In this manner, the light emitting diodes according to the exemplary embodiments may be applied to headlights, particularly, headlights for vehicles, like the headlight according to the present exemplary embodiment.

What is claimed is:

1. A light emitting diode comprising:
   a light emitting structure comprising a second conductive type semiconductor layer, an active layer disposed on an upper surface of the second conductive type semiconductor layer, and a first conductive type semiconductor layer disposed on an upper surface of the active layer;
   a first electrode electrically connected to the first conductive type semiconductor layer;
   a current blocking layer disposed on a lower surface of the light emitting structure; and
   a second electrode electrically connected to the second conductive type semiconductor layer,
   wherein the second electrode comprises:
      a first reflective metal layer adjoining the second conductive type semiconductor layer; and
      a second reflective metal layer covering a lower surface of the current blocking layer and a lower surface of the first reflective metal layer, the second reflective metal layer adjoining a portion of the second conductive type semiconductor layer,
   wherein a contact resistance between the second reflective metal layer and the second conductive type semiconductor layer is higher than a contact resistance between the first reflective metal layer and the second conductive type semiconductor layer, and
   wherein the first reflective metal layer is spaced apart from the current blocking layer.

2. The light emitting diode according to claim 1, wherein the second reflective metal layer comprises an Al layer, the Al layer adjoining the current blocking layer, the first reflective metal layer, and the second conductive type semiconductor layer.

3. The light emitting diode according to claim 2, further comprising a barrier metal layer disposed on a lower surface of the second reflective metal layer,
   wherein the barrier metal layer comprises Ni.

4. The light emitting diode according to claim 1, wherein:
   the current blocking layer comprises a first region adjoining the second conductive type semiconductor layer;
   the first reflective metal layer comprises a second region adjoining the second conductive type semiconductor layer;
   the second reflective metal layer comprises a third region adjoining the second conductive type semiconductor layer; and
   the first region, the second region, and the third region have different electrical junction characteristics from each other.

5. The light emitting diode according to claim 4, wherein the third region and the second reflective metal layer form Schottky junction therebetween.

6. The light emitting diode according to claim 5, wherein the third region has a smaller area than the second region.

7. The light emitting diode according to claim 4, wherein the third region is located between the first region and the second region.

8. The light emitting diode according to claim 7, wherein a portion of the second reflective metal layer covers a side surface of the current blocking layer.

9. The light emitting diode according to claim 8, wherein the side surface of the current blocking layer comprises an inclined surface.

10. The light emitting diode according to claim 1, wherein the second reflective metal layer comprises a protrusion protruding beyond a side surface of the light emitting structure.

11. The light emitting diode according to claim 10, further comprising an insulation layer disposed on an upper surface and the side surface of the light emitting structure.

12. The light emitting diode according to claim 11, wherein a portion of the current blocking layer is disposed on an upper surface of the protrusion.

13. The light emitting diode according to claim 12, wherein the insulation layer and the current blocking layer adjoin each other.

14. The light emitting diode according to claim 13, wherein the insulation layer and the current blocking layer comprise the same material.

15. The light emitting diode according to claim 11, wherein the insulation layer comprises a roughened upper surface.

16. The light emitting diode according to claim 1, wherein:
   the first electrode comprises an electrode pad and an upper extension;
   the upper extension comprises a region overlapping the current blocking layer in a perspective view;
   the current blocking layer has a greater width than the upper extension in the overlapped region, such that the upper extension is disposed between opposing sides of the current blocking layer; and
   each of portions of the current blocking layer disposed beyond both sides of the upper extension in a width direction has the same or greater width than the upper extension.

17. A light emitting diode comprising:
   a light emitting structure comprising a second conductive type semiconductor layer, an active layer disposed on an upper surface of the second conductive type semiconductor layer, and a first conductive type semiconductor layer disposed on an upper surface of the active layer;
   a first electrode electrically connected to the first conductive type semiconductor layer;
   a current blocking layer disposed on a lower surface of the light emitting structure; and
   a second electrode disposed on a lower surface of the light emitting structure and electrically connected to the second conductive type semiconductor layer, wherein the second electrode comprises:
- a first reflective metal layer adjoining the second conductive type semiconductor layer; and
- a second reflective metal layer covering a lower surface of the current blocking layer and a lower surface of the first reflective metal layer, wherein a bonding strength between the current blocking layer and the second reflective metal layer is greater than a bonding strength between the current blocking layer and the first reflective metal layer, and wherein the first reflective metal layer is spaced apart from the current blocking layer.

18. The light emitting diode according to claim 17, wherein the second reflective metal layer comprises Al.

19. The light emitting diode according to claim 18, wherein a portion of the second reflective metal layer covers a side surface of the current blocking layer and separates the current blocking layer from the first reflective metal layer.

20. A light emitting diode comprising:
- a light emitting structure comprising a second conductive type semiconductor layer, an active layer disposed on an upper surface of the second conductive type semiconductor layer, and a first conductive type semiconductor layer disposed on an upper surface of the active layer;
- a first electrode electrically connected to the first conductive type semiconductor layer;
- a current blocking layer disposed on a lower surface of the light emitting structure; and
- a second electrode electrically connected to the second conductive type semiconductor layer, wherein the second electrode comprises:
- a first reflective metal layer adjoining the second conductive type semiconductor layer; and
- a second reflective metal layer covering a lower surface of the current blocking layer and a lower surface of the first reflective metal layer, the second reflective metal layer adjoining a portion of the second conductive type semiconductor layer, and wherein the first reflective metal layer is spaced apart from the current blocking layer.

* * * * *